United States Patent
Foong et al.

(10) Patent No.: US 9,474,162 B2
(45) Date of Patent: Oct. 18, 2016

(54) CIRCUIT SUBSTRATE AND METHOD OF MANUFACTURING SAME

(71) Applicants: Chee Seng Foong, Sg. Buloh (MY); Lan Chu Tan, Singapore (SG)

(72) Inventors: Chee Seng Foong, Sg. Buloh (MY); Lan Chu Tan, Singapore (SG)

(73) Assignee: FREESCALE SEMIOCNDUCTOR, INC., Austin, TX (US)

(*) Notice: Subject to any disclaimer, the term of this patent is extended or adjusted under 35 U.S.C. 154(b) by 99 days.

(21) Appl. No.: 14/151,828

(22) Filed: Jan. 10, 2014

(65) Prior Publication Data
US 2015/0201489 A1 Jul. 16, 2015

(51) Int. Cl.
*H01L 21/00* (2006.01)
*H05K 3/00* (2006.01)
*H05K 1/09* (2006.01)

(52) U.S. Cl.
CPC .............. *H05K 3/007* (2013.01); *H05K 1/097* (2013.01); *H05K 2203/107* (2013.01)

(58) Field of Classification Search
CPC ...... H05K 1/0296; H05K 1/111; H05K 3/46; H05K 3/0091; H05K 3/007; H05K 1/097; H05K 2203/107; H01L 2224/32225; H01L 2924/014; H01L 2224/73265; H01L 2924/1517; H01L 23/49822; H01L 21/4857
USPC .................. 438/45, 107, 610; 257/731, 773, 257/E21.317
See application file for complete search history.

(56) References Cited

U.S. PATENT DOCUMENTS

| | | |
|---|---|---|
| 4,855,102 A | 8/1989 | Okada |
| 5,053,090 A | 10/1991 | Beaman |
| 5,724,727 A * | 3/1998 | Chopra ............... H01L 21/4846 29/832 |
| 6,146,567 A | 11/2000 | Sachs |
| 6,173,887 B1 | 1/2001 | Mead |
| 6,294,405 B1 | 9/2001 | Higgins |
| 6,676,892 B2 | 1/2004 | Das |
| 6,737,295 B2 | 5/2004 | Pendse |
| 7,205,230 B2 | 4/2007 | Mashino |
| 7,208,824 B2 | 4/2007 | Lee |
| 7,279,409 B2 | 10/2007 | Shiu |
| 7,422,973 B2 | 9/2008 | Shiu |
| 2004/0241585 A1* | 12/2004 | Kato ........................ H05K 3/02 430/311 |
| 2007/0099413 A1* | 5/2007 | Shiu ..................... H01L 21/4853 438/613 |
| 2008/0057616 A1* | 3/2008 | Robinson ............ H01L 31/0322 438/95 |
| 2010/0029045 A1* | 2/2010 | Ramanathan ......... H01L 21/565 438/114 |
| 2012/0153501 A1* | 6/2012 | Murai ..................... H01L 23/14 257/774 |

(Continued)

OTHER PUBLICATIONS

H. Sturm et al., "New Connection Technology for Microsystems Using Inktelligent Printing and Functional Nanoscaled Inks", IEEE 2009.

(Continued)

*Primary Examiner* — Yosef Gebreyesus
(74) *Attorney, Agent, or Firm* — Charles E. Bergere

(57) ABSTRACT

A circuit interconnecting substrate manufacturing method includes depositing a first layer of metallic powder on top of a carrier, and then forming a first layer of electrically conductive traces from the first layer of metallic powder. A second layer of metallic powder is then deposited onto at least one region of the first layer of electrically conductive traces. Then a second layer of electrically conductive traces is formed from the second layer of metallic powder and each trace of the second layer is electrically coupled to a trace of the first layer. An insulating material is deposited onto the carrier to provide an insulating substrate that supports the traces. The method does not require the use of any wet chemicals or chemical etching steps.

10 Claims, 11 Drawing Sheets

(56) References Cited

U.S. PATENT DOCUMENTS

| | | | |
|---|---|---|---|
| 2012/0228651 A1* | 9/2012 | Horng | H01L 25/0753 257/93 |
| 2012/0280388 A1 | 11/2012 | Wu | |
| 2012/0306080 A1 | 12/2012 | Yu | |
| 2013/0136868 A1* | 5/2013 | Bruck | B05D 3/06 427/554 |
| 2013/0200516 A1* | 8/2013 | Nakatani | H01L 23/15 257/737 |

OTHER PUBLICATIONS

J.A. Manriquez-Frayre and D.L. Bourell, Selective Laser Sintering of Binary Metallic Powder, U.Texas-Austin, 1990.

* cited by examiner

CIRCUIT SUBSTRATE AND METHOD OF MANUFACTURING SAME

BACKGROUND OF THE INVENTION

The present invention relates generally to circuit substrates and, more particularly, to a circuit substrate manufactured using metal powder and three-dimensional printing.

Typical types of packaged semiconductors are Quad Flat Package (QFP) semiconductors that are formed with a semiconductor die mounted to a lead frame. The lead frame is formed from a sheet of metal that includes a die attach pad often called a flag, tie bars that attach the flag to a frame, and lead fingers. The lead fingers are electrically connected to bonding pads of a semiconductor die with bond wires. The lead fingers provide a means of easily electrically connecting the die to circuit boards and the like. After wire bonding, the die, bond wires, and portions of the lead fingers are encapsulated in a plastic material leaving only sections of the leads fingers exposed. These exposed leads are cut from the frame of the lead frame (singulated) and bent for ease of connection to a circuit board. However, the inherent structure of QFP packages results in limiting the number of leads, and therefore the number of package external electrical connections, that can be used for a specific QFP package size. Further, the external electrical connections of the lead frame based grid array packages are typically fabricated from a thin single sheet of conductive material, such as copper or aluminium, and these connections may not be sufficiently held within the encapsulating compound (material) and may become lose.

An alternative to lead frames in the assembly of semiconductor devices, is the use of circuit substrates. These substrates have internal and external mounting pads interconnected typically by vias and runners such that the substrates resemble miniature Printed Circuit Boards (PCBs). The assembly of a semiconductor device with such substrates typically includes directly mounting of the die bond pads to the internal mounting pads of the substrate and then encapsulating the die with a molding compound. The external mounting pads of the substrate provide external connections as a grid array that are typically mounted to a larger circuit substrate such as a PCB or similar structure.

Current processes for the manufacture of the above circuit substrates are relatively complex and expensive. These processes include the use of masking, etching, plating and cleaning, which can be time consuming and may use environmentally unfriendly chemicals. Accordingly, it would be advantageous to have a simpler and less expensive method of making a circuit substrate.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
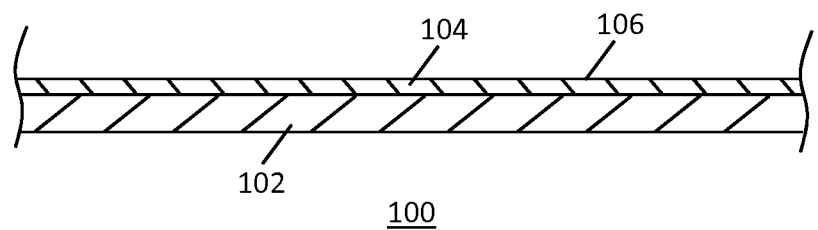
FIG. 1 is a partial cross-sectional side view of a carrier and a first layer of metallic powder, in accordance with a first preferred embodiment of the present invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components, or steps. An element or step proceeded by "comprises . . . a" does not, without more constraints, preclude the existence of additional identical elements or steps that comprises the element or step. As used herein, the term semiconductor device refers to a packaged semiconductor die.

In one embodiment, the present invention provides a method of manufacturing a circuit interconnecting substrate. The method comprises depositing a first layer of metallic powder on top of at least one region of a carrier and then forming a first layer of electrically conductive traces from the first layer of metallic powder. Next a second layer of metallic powder is deposited onto at least one region of the first layer of electrically conductive traces and then a second layer of electrically conductive traces is formed from the second layer of metallic powder. Each trace of the second layer of electrically conductive traces is electrically coupled to at least one trace of the first layer of electrically conductive traces. An insulating material is deposited onto the carrier. The insulating material provides an insulating substrate that supports the traces.

In another embodiment, the present invention provides a circuit interconnecting substrate. The substrate is manufactured by a method comprising depositing a first layer of metallic powder on top of at least one region of a carrier and then forming a first layer of electrically conductive traces from the first layer of metallic powder. A second layer of metallic powder is deposited onto at least one region of the first layer of electrically conductive traces is then performed. A second layer of electrically conductive traces is formed from the second layer of metallic powder. Each trace of the second layer of electrically conductive traces is electrically coupled to at least one trace of the first layer of electrically conductive traces. An insulating material is deposited onto the carrier. The insulating material provides an insulating substrate that supports the traces.

Referring now to FIG. 1, a partial cross-sectional side view of an arrangement 100 of a carrier 102 and a first layer of metallic powder 104, in accordance with a first preferred embodiment of the present invention, is shown. The first layer of metallic powder 104 is deposited directly on top of at least one region of the carrier 102 and in this specific embodiment the first layer of metallic powder 104 completely covers the carrier 102. As shown, the first layer of metallic powder 104 is an even layer that has been deposited with the assistance of a roller so that an upper surface 106 of the first layer of metallic powder 104 is substantially planar.

Figure 2:
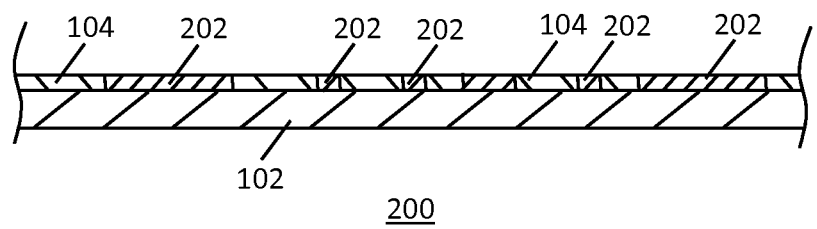
FIG. 2 is a partial cross-sectional side view of a an assembly including a first layer of electrically conductive traces selectively formed from the metallic powder of FIG. 1, in accordance with the first preferred embodiment of the present invention.

FIG. 2 is a partial cross-sectional side view of an assembly 200 including a first layer of electrically conductive traces 202 selectively formed from the first layer of metallic powder 104, in accordance with the first preferred embodiment of the present invention. The first layer of electrically conductive traces 202 is formed from the first layer of metallic powder 104, which is selectively laser sintered or selectively melted by a laser system and then subsequently solidified.

Figure 3:
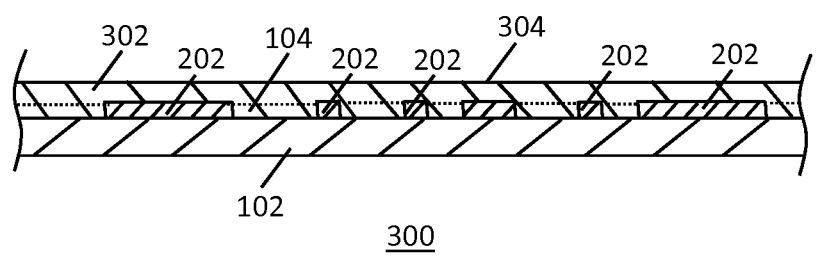
FIG. 3 is a partial cross-sectional side view of a second layer of metallic powder deposited onto the first layer of electrically conductive traces of FIG. 2, in accordance with the first preferred embodiment of the present invention.

FIG. 3 is a partial cross-sectional side view of an arrangement 300 of a second layer of metallic powder 302 deposited onto the first layer of electrically conductive traces 202, in accordance with the first preferred embodiment of the present invention. In this particular embodiment, the second layer of metallic powder 302 completely covers the first layer of metallic powder 104 and the first layer of electrically conductive traces 202. As shown, the second layer of metallic powder 302 is an even layer that has been deposited with the assistance of a roller so that an upper surface 304 of the second layer of metallic powder 302 is substantially planar.

Figure 4:
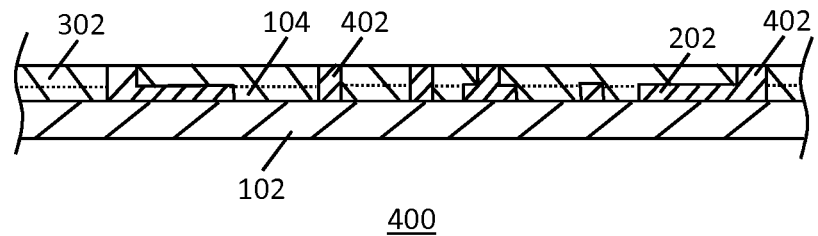
FIG. 4 is a partial cross-sectional side view of a layered assembly including a second layer of electrically conductive traces selectively formed from the second layer of metallic powder of FIG. 3, in accordance with the first preferred embodiment of the present invention.

FIG. 4 is a partial cross-sectional side view of a layered assembly 400 including a second layer of electrically conductive traces 402 selectively formed from the second layer of metallic powder 302, in accordance with the first preferred embodiment of the present invention. The second layer of electrically conductive traces 402 is formed from the second layer of metallic powder 302, which is selectively laser sintered or selectively melted by a laser system and then subsequently solidified.

Figure 5:
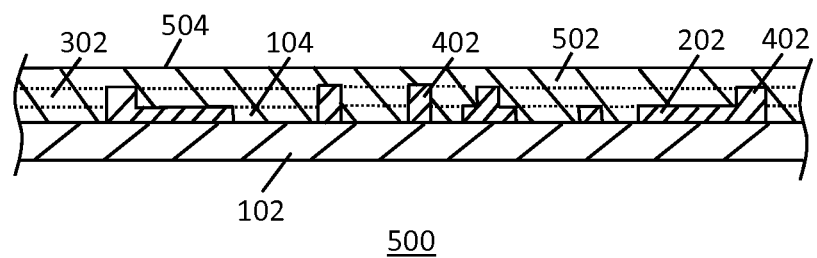
FIG. 5 is a partial cross-sectional side view of a third layer of metallic powder deposited onto the second layer of electrically conductive traces of FIG. 4, in accordance with the first preferred embodiment of the present invention.

FIG. 5 is a partial cross-sectional side view of an arrangement 500 of a third layer of metallic powder 502 deposited onto the second layer of electrically conductive traces 402, in accordance with the first preferred embodiment of the present invention. In this particular embodiment the third layer of metallic powder 502 completely covers the second layer of metallic powder 302 and the second layer of electrically conductive traces 402. As shown, the third layer of metallic powder 502 is an even layer that has been deposited with the assistance of a roller so that an upper surface 504 of the third layer of metallic powder 502 is substantially planar.

Figure 6:
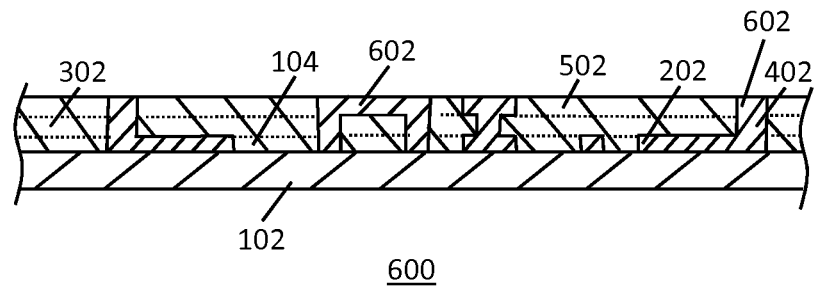
FIG. 6 is a partial cross-sectional side view of a further layered assembly including a third layer of electrically conductive traces selectively formed from the third layer of metallic powder of FIG. 5, in accordance with the first preferred embodiment of the present invention.

FIG. 6 is a partial cross-sectional side view of a further layered assembly 600 including a third layer of electrically conductive traces 602 selectively formed from the third layer of metallic powder 502, in accordance with the first preferred embodiment of the present invention. As above, the third layer of electrically conductive traces 602 is formed from the third layer of metallic powder 502, which is selectively laser sintered or selectively melted by a laser system and then subsequently solidified.

Figure 7:
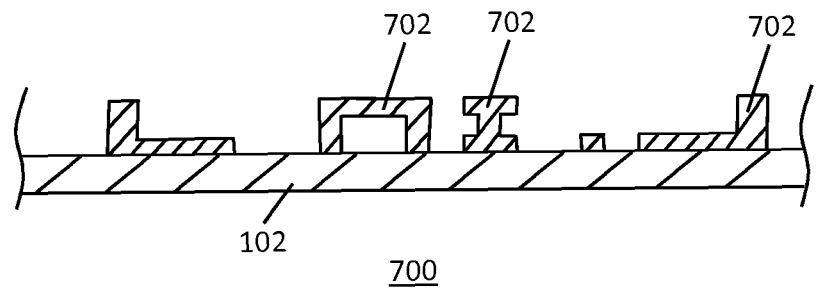
FIG. 7 is a partial cross-sectional side view of a pre-insulated trace assembly formed by processing the further layered assembly of FIG. 6, in accordance with the first preferred embodiment of the present invention.

FIG. 7 is a partial cross-sectional side view of a pre-insulated trace assembly 700 formed from processing the further layered assembly 600, in accordance with the first preferred embodiment of the present invention. The pre-insulated trace assembly 700 includes free standing traces 702, selectively formed from traces of the first, second and third layer of electrically conductive traces 202, 402 and 602. As shown, any remaining metallic powder forming layers 104, 302, and 502 that was not sintered or melted (to form the traces 202, 402 and 602) has been removed by a vacuuming process.

Figure 8:
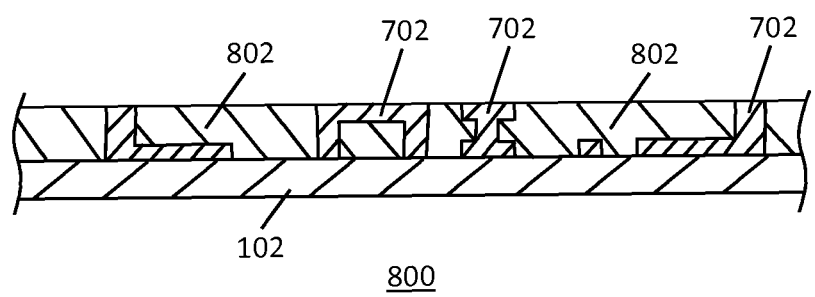
FIG. 8 is a partial cross-sectional side view of a carrier supported circuit substrate formed from the pre-insulated trace assembly of FIG. 7, in accordance with the first preferred embodiment of the present invention.

FIG. 8 is a partial cross-sectional side view of a carrier supported circuit interconnecting substrate structure 800 formed from the pre-insulated trace assembly 700 in accordance with the first preferred embodiment of the present invention. In this embodiment an insulating material has been deposited onto the carrier 102 in a manner such that the insulating material provides an insulating substrate 802 that insulates and supports the traces 702. This insulating substrate 802 is a press moulded resin however other depositing processes and materials can be used. In other embodiments the insulating substrate 802 can be formed from a deposited coated in liquid that is selectively cured by way of raster scanning with Ultra Violet light, laser curing or other means of energy transfer as will be apparent to a person skilled in the art.

Figure 9:
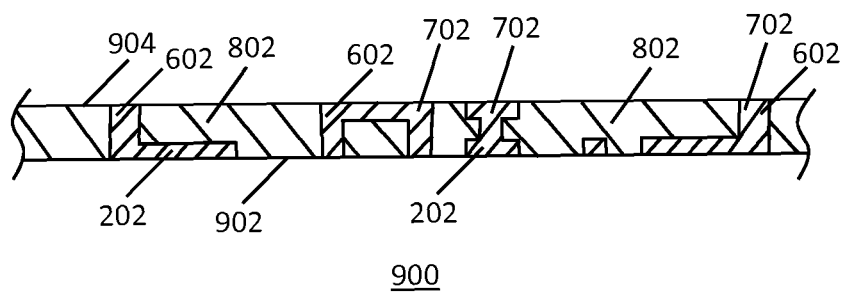
FIG. 9 is a partial cross-sectional side view of the circuit substrate of FIG. 8 when removed from the carrier.

FIG. 9 is a partial cross-sectional side view of a circuit interconnecting substrate structure 900 when removed from the carrier 102. As shown, the insulating substrate 802 forms a sheet with a first side 902 and a second side 904. Also, the first layer of electrically conductive traces 202 is accessible from the first side 902 and the third layer of electrically conductive traces 602 is accessible from the second side 904. As shown, both sides 902, 904 are substantially planar which if necessary have been treated by grinding or an abrasive cleaning process.

Figure 10:
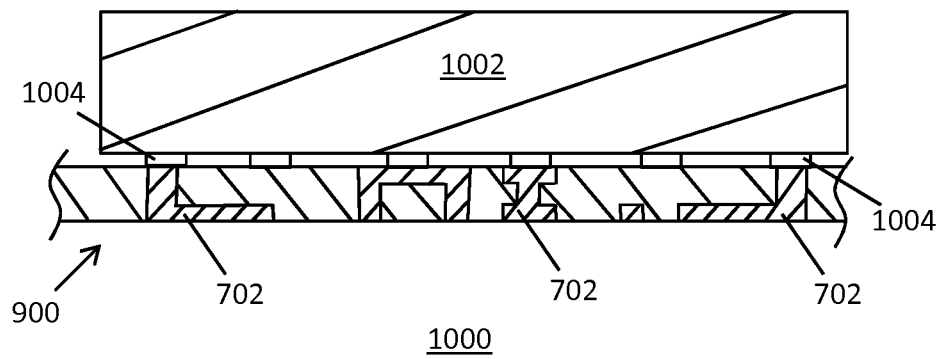
FIG. 10 is a partial cross-sectional side view of a semiconductor device assembled using the circuit substrate of FIG. 9 in accordance with a first preferred embodiment of the present invention.

FIG. 10 is a partial cross-sectional side view of a semiconductor die package 1000 formed from the circuit interconnecting substrate structure 900 in accordance with a first preferred embodiment of the present invention. As shown, there is a silicon die 1002 mounted on the circuit interconnecting substrate structure 900 so that external connection pads 1004 of the die 1002 are electrically selectively coupled to the traces 702. The semiconductor die package 1000 is typically encapsulated in an electrical insulating compound and then singulated as will be apparent to a person skilled in the art.

Figure 11:
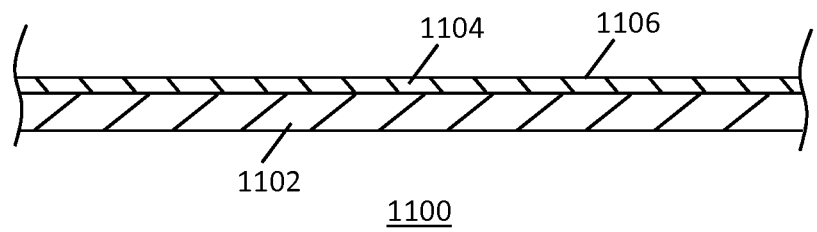
FIG. 11 is a partial cross-sectional side view of a carrier and a first layer of metallic powder, in accordance with a second preferred embodiment of the present invention.

FIG. 11 is a partial cross-sectional side view of an arrangement 1100 of a carrier 1102 and a first layer of metallic powder 1104, in accordance with a second preferred embodiment of the present invention. The first layer of metallic powder 1104 is deposited directly on top of at least one region of the carrier 1102 and in this specific embodiment the first layer of metallic powder 1104 completely covers the carrier 1102. As shown, the first layer of metallic powder 1104 is an even layer that has been deposited with the assistance of a roller so that an upper surface 1106 of the first layer of metallic powder 1104 is substantially planar.

Figure 12:
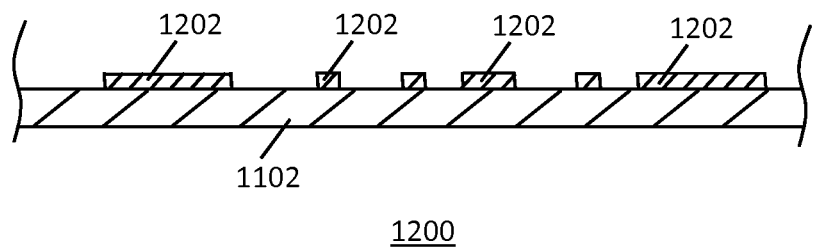
FIG. 12 is a partial cross-sectional side view of an arrangement including a first layer of electrically conductive traces selectively formed from the first layer of metallic powder of FIG. 11, in accordance with the second preferred embodiment of the present invention.

FIG. 12 is a partial cross-sectional side view of an arrangement 1200 including a first layer of electrically conductive traces 1202 selectively formed from the first layer of metallic powder 1104, in accordance with the second preferred embodiment of the present invention. The first layer of electrically conductive traces 1202 is formed from the first layer of metallic powder 1104 which is selectively sintered or melted and subsequently solidified. In this particular embodiment the first layer of electrically conductive traces 1202 is formed by a laser melting or laser sintering process of regions of the first layer of metallic powder 1104. Also, any remaining metallic powder forming the first layer of metallic powder 1104 that was not sintered or melted (to form the traces 1202) has been removed by a vacuuming process.

Figure 13:
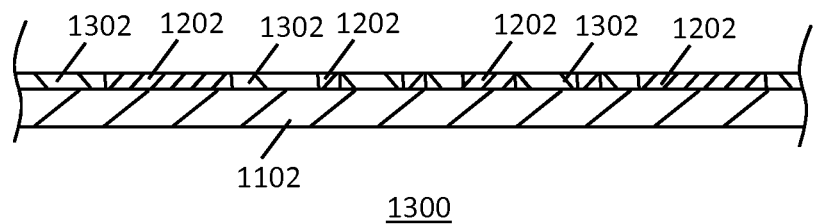
FIG. 13 is a partial cross-sectional side view of a single layer insulated assembly formed from the first layer of electrically conductive traces of FIG. 12, in accordance with the second preferred embodiment of the present invention.

FIG. 13 is a partial cross-sectional side view of a single layer insulated assembly 1300 formed from the first layer of electrically conductive traces 1202, in accordance with the second preferred embodiment of the present invention. In this embodiment an insulating material has been deposited onto the carrier 1102 in a manner such that the insulating material provides a first layer insulating substrate 1302 that insulates and supports the traces 1202. This insulating substrate 1302 is a press moulded resin however, as above, other depositing processes and materials can be used. Also, as above, in other embodiments the insulating substrate 1302 can be formed from a coated in liquid that is selectively cured by way of raster scanning with Ultra Violet light, laser curing or other means of energy transfer as will be apparent to a person skilled in the art.

Figure 14:
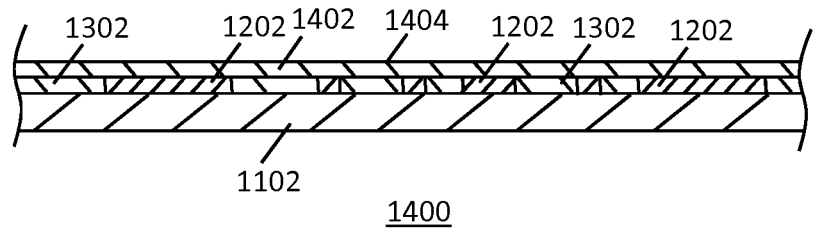
FIG. 14 is a partial cross-sectional side view of an arrangement including a second layer of metallic powder selectively deposited onto the single layer insulated assembly of FIG. 13, in accordance with the second preferred embodiment of the present invention.

FIG. 14 is a partial cross-sectional side view of an arrangement 1400 including a second layer of metallic powder 1402 selectively deposited onto the single layer insulated assembly 1300, in accordance with the second preferred embodiment of the present invention. In this particular embodiment, the second layer of metallic powder 1402 completely covers the first layer of electrically conductive traces 1202 and the first layer insulating substrate 1302. As shown, the second layer of metallic powder 1402 is an even layer that has been deposited with the assistance of a roller so that an upper surface 1404 of the second layer of metallic powder 1402 is substantially planar.

Figure 15:
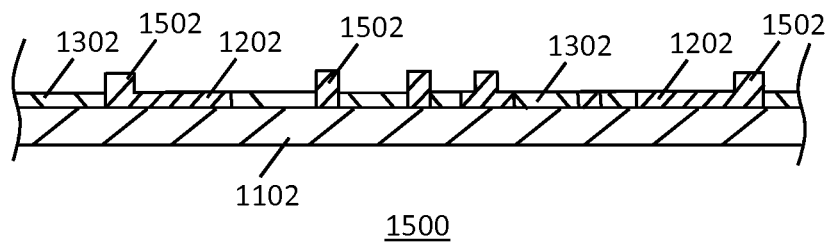
FIG. 15 is a partial cross-sectional side view of a double layered electrically conductive trace assembly formed from the arrangement of FIG. 14, in accordance with the second preferred embodiment of the present invention.

FIG. 15 is a partial cross-sectional side view of a double layered electrically conductive trace assembly 1500 formed from the arrangement 1400, in accordance with the second preferred embodiment of the present invention. The assembly 1500 includes a second layer of electrically conductive traces 1502 formed from the second layer of metallic powder 1402, which is selectively sintered or melted and subsequently solidified. In this particular embodiment the second layer of electrically conductive traces 1502 is formed by a laser melting or laser sintering process of regions of the second layer of metallic powder 1402. Also, as shown any remaining metallic powder forming the second layer of metallic powder 1402 that was not sintered or melted (to form the traces 1502) has been removed by a vacuuming process.

Figure 16:
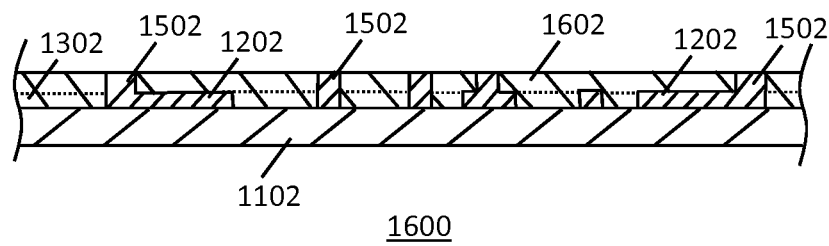
FIG. 16 is a partial cross-sectional side view of a double layer insulated assembly formed from the assembly of FIG. 15, in accordance with the second preferred embodiment of the present invention.

Referring to FIG. 16, a partial cross-sectional side view of a double layer insulated assembly 1600 formed from the assembly 1500, in accordance with the second preferred embodiment of the present invention, is shown. In this embodiment an insulating material has been deposited onto exposed regions of the first layer of electrically conductive traces 1202 and exposed regions of the first layer insulating substrate 1302. This insulating material provides a second layer insulating substrate 1602 that insulates and at least partially supports the traces 1502. Also, the insulating substrate 1502 is a press moulded resin however, as above, other depositing processes and materials can be used. Again, as above, in other embodiments the insulating substrate 1502 can be formed from a coated in liquid that is selectively cured by way of raster scanning with Ultra Violet light, laser curing or other means of energy transfer as will be apparent to a person skilled in the art.

Figure 17:
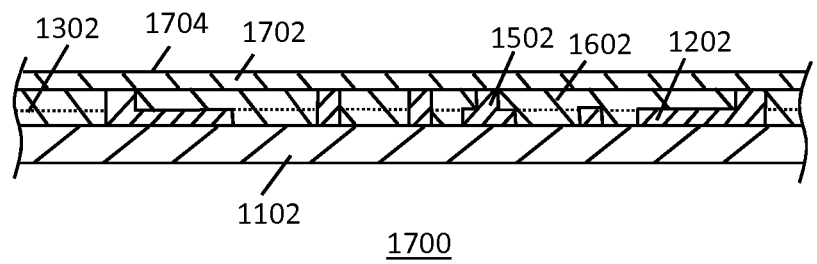
FIG. 17 is a partial cross-sectional side view of an arrangement including a third layer of metallic powder selectively deposited onto the double layer insulated assembly of FIG. 16, in accordance with the second preferred embodiment of the present invention.

FIG. 17 illustrates a partial cross-sectional side view of an arrangement 1700 including a third layer of metallic powder 1702 selectively deposited onto the double layer insulated assembly 1600, in accordance with the second preferred embodiment of the present invention. The third layer of metallic powder 1702 completely covers the second layer of electrically conductive traces 1502 and the second layer insulating substrate 1602. As shown, the second layer of metallic powder 1402 is an even layer that has been deposited with the assistance of a roller so that an upper surface 1704 of the second layer of metallic powder 1702 is substantially planar.

Figure 18:
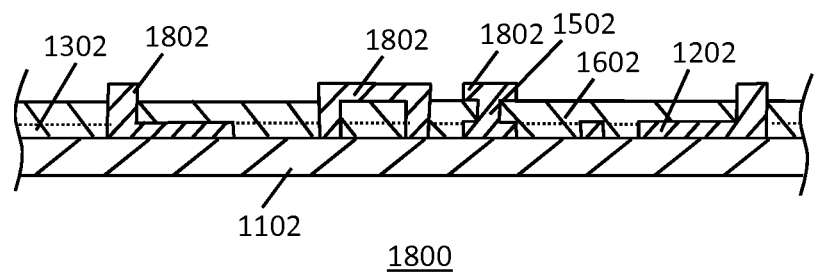
FIG. 18 is a partial cross-sectional side view of a triple layered electrically conductive trace assembly formed from the arrangement of FIG. 17, in accordance with the second preferred embodiment of the present invention.

In FIG. 18 there is illustrated a partial cross-sectional side view of a triple layered electrically conductive trace assembly 1800 formed from the arrangement 1700, in accordance with the second preferred embodiment of the present invention. The assembly 1800 includes a third layer of electrically conductive traces 1802 formed from the third layer of metallic powder 1702, which is selectively sintered or melted and subsequently solidified. In this particular embodiment the third layer of electrically conductive traces 1802 is formed by a laser melting or laser sintering process of regions of the third layer of metallic powder 1702. Also, as shown any remaining metallic powder forming the third layer of metallic powder 1702 that was not sintered or melted (to form the traces 1802) has been removed by a vacuuming process.

Figure 19:
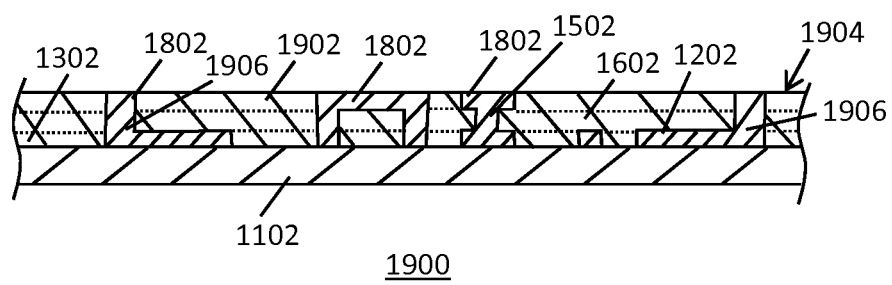
FIG. 19 is a partial cross-sectional side view of a carrier supported circuit substrate structure formed from the assembly of FIG. 18, in accordance with the second preferred embodiment of the present invention.

Referring to FIG. 19, there is illustrated a partial cross-sectional side view of a carrier supported circuit interconnecting substrate structure 1900 formed from the assembly 1800, in accordance with the second preferred embodiment of the present invention. In this embodiment an insulating material has been deposited onto exposed regions of the second layer of electrically conductive traces 1502 (none illustrated in FIG. 19) and exposed regions of the second layer insulating substrate 1602. This insulating material provides a third layer insulating substrate 1902 that insulates and at least partially supports the traces 1802. This insulating substrate 1902 is a press moulded resin however, as above, other depositing processes and materials can be used such as a cured deposited dialectic liquid. Also, the first, second and third layer insulating substrates 1302, 1602 and 1902 form an integrated insulating substrate 1904 as will be apparent to a person skilled in the art. Furthermore, integrated traces 1906 have been selectively formed from the first, second and third layer of electrically conductive traces 1202, 1502 and 1802.

Figure 20:
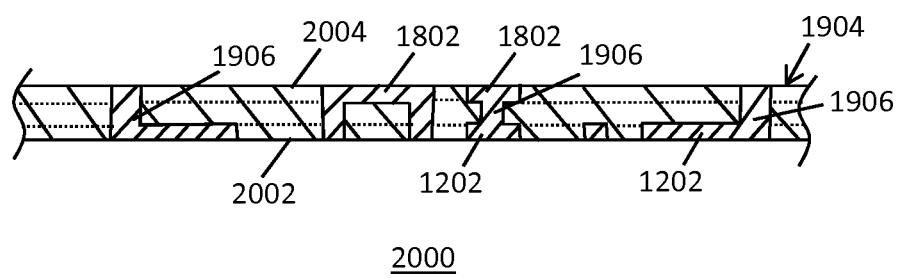
FIG. 20 is a partial cross-sectional side view of the circuit substrate structure of FIG. 19 when removed from the carrier.

FIG. 20 is a partial cross-sectional side view of a circuit interconnecting substrate structure 2000 when removed from the carrier 1102. As shown, the insulating substrate 1904 forms a sheet with a first side 2002 and a second side 2004. Also, the first layer of electrically conductive traces 1202 is accessible from the first side 2002 and the third layer of electrically conductive traces 1802 is accessible from the second side 2004.

Figure 21:
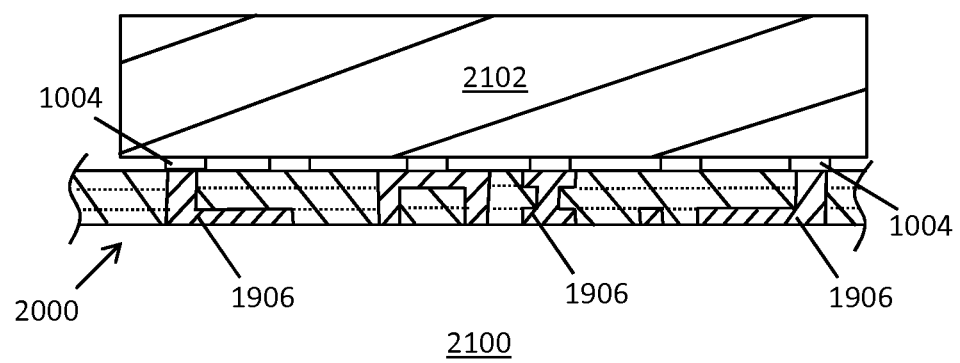
FIG. 21 is a partial cross-sectional side view of a semiconductor device assembled using the circuit substrate of FIG. 20 in accordance with a second preferred embodiment of the present invention.

Referring to FIG. 21, there is illustrated a partial cross-sectional side view of a semiconductor die package 2100 formed from the circuit interconnecting substrate structure 2000 in accordance with a second preferred embodiment of the present invention. As shown, there is a silicon die 2102 mounted on the circuit interconnecting substrate structure 1900 so that external connection pads 2104 of the die 2102 are electrically selectively coupled to the traces 1906. The semiconductor die package 2100 is typically encapsulated in an electrical insulating compound and then singulated as will be apparent to a person skilled in the art.

Figure 22:
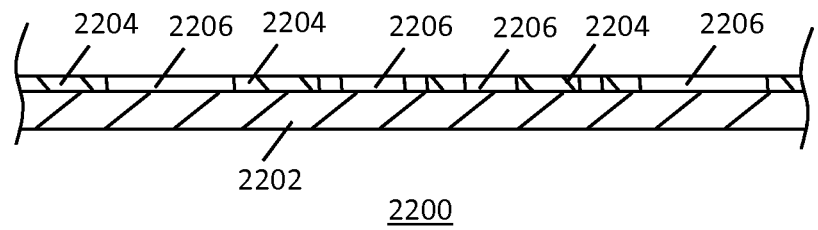
FIG. 22 is a partial cross-sectional side view of a carrier and a selectively deposited first insulating layer, in accordance with a third preferred embodiment of the present invention.

FIG. 22 is a partial cross-sectional side view of an arrangement 2200 of a carrier 2202 and a selectively deposited first insulating layer 2204, in accordance with a third preferred embodiment of the present invention. The first insulating layer 2204 is selectively deposited directly on top of the carrier 2202 by a process that provides first layer apertures 2206 in the first insulating layer 2204. More specifically, the first insulating layer 2204 is formed by a dielectric film coating rolled onto the carrier 2202. The dielectric film is cured by being selectively exposed to Ultra Violet (UV) light to form the first insulating layer 2204, and thereafter uncured regions of the film are removed to form the first layer apertures 2206. As above this film may be formed from a selectively cured dielectric liquid deposit.

Figure 23:
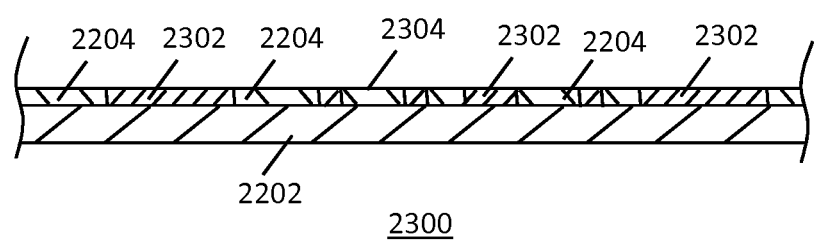
FIG. 23 is a partial cross-sectional side view of a single layer insulated assembly including first layer electrically conductive traces located in first layer apertures of the first insulating layer of FIG. 22, in accordance with the third preferred embodiment of the present invention.

Referring to FIG. 23, there is illustrated a partial cross-sectional side view of a single layer insulated assembly 2300, in accordance with the third preferred embodiment of the present invention. The assembly 2300 includes first layer electrically conductive traces 2302 located in the first layer apertures 2206. The first layer electrically conductive traces 2302 are formed from a first layer of metallic powder that is deposited directly on top of the carrier 2202 in the first layer apertures 2206. The first layer of metallic powder is then sintered, or melted and solidified, to form the first layer electrically conductive traces 2302. Also, as shown an upper surface 2304 of the assembly 2300 is planar which if necessary has been treated by grinding upper surfaces of the first layer electrically conductive traces 2302 and the first insulating layer 2204.

Figure 24:
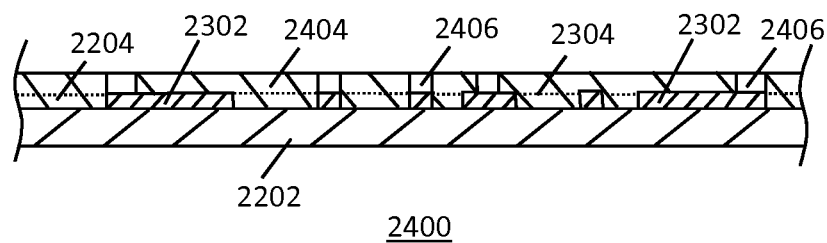
FIG. 24 is a partial cross-sectional side view of a partially completed double layered insulated assembly formed from the assembly of FIG. 23, in accordance with the third preferred embodiment of the present invention.

FIG. 24 is a partial cross-sectional side view of a partially completed double layered insulated assembly 2400 formed from the assembly 2300, in accordance with the third preferred embodiment of the present invention. The assembly 2400 includes a second insulating layer 2404 selectively deposited directly on top of the first insulating layer 2204 and regions of the first layer electrically conductive traces 2302. The second insulating layer 2404 is selectively deposited by a process that provides second layer apertures 2406 in the second insulating layer 2404. More specifically, the second insulating layer 2404 is formed by a dielectric film coating rolled onto the upper surface 2304. The dielectric film is selectively cured by being selectively exposed to Ultra Violet light to form the second insulating layer 2404, and thereafter uncured regions of the film are removed to form the second layer apertures 2406. Again, as above this film may be formed from a selectively cured dielectric liquid deposit.

Figure 25:
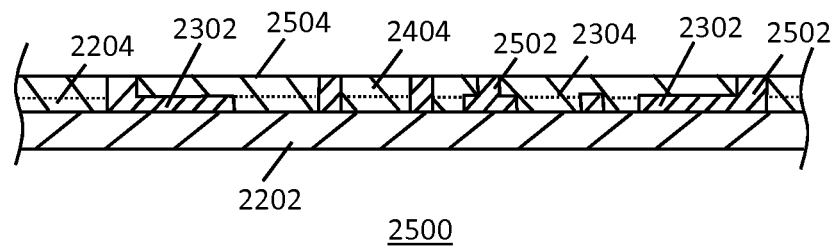
FIG. 25 is a partial cross-sectional side view of a double layer insulated assembly including second layer electrically conductive traces located in second layer apertures of a second insulating layer of FIG. 25, in accordance with the third preferred embodiment of the present invention.

FIG. 25 illustrates a partial cross-sectional side view of a double layer insulated assembly 2500, in accordance with the third preferred embodiment of the present invention. The assembly 2500 includes second layer electrically conductive traces 2502 located in the second layer apertures 2406. The second layer electrically conductive traces 2502 are formed from a second layer of metallic powder that is deposited directly on top of the surface 2304 in the second layer apertures 2406. The second layer of metallic powder is then sintered, or melted and solidified, to form the second layer electrically conductive traces 2502. Also, as shown an upper surface 2504 of the assembly 2500 is planar which if necessary has been treated by grinding upper surfaces of the second layer electrically conductive traces 2502 and the second insulating layer 2404.

Figure 26:
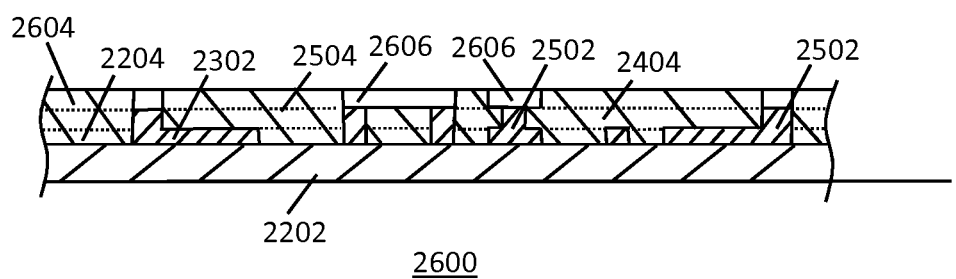
FIG. 26 is a partial cross-sectional side view of a partially completed triple layered insulated assembly formed from the assembly of FIG. 25, in accordance with the third preferred embodiment of the present invention.

Referring to FIG. 26, there is illustrated a partial cross-sectional side view of a partially completed triple layered insulated assembly 2600 formed from the assembly 2500, in accordance with the third preferred embodiment of the present invention. The assembly 2600 includes a third insulating layer 2604 selectively deposited directly on top of the second insulating layer 2404 and regions of the second layer electrically conductive traces 2502. The third insulating layer 2604 is selectively deposited by a process that provides third layer apertures 2606 in the third insulating layer 2604. More specifically, the third insulating layer 2604 is formed by a dielectric film coating rolled onto the upper surface 2504. The dielectric film is cured by being selectively exposed to Ultra Violet light to form the third insulating layer 2604, and thereafter uncured regions of the film are removed to form the third layer apertures 2606. Again, as above this film may be formed from a selectively cured dielectric liquid deposit.

Figure 27:
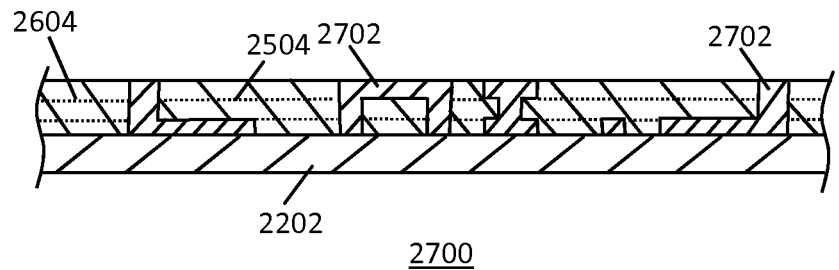
FIG. 27 is a partial cross-sectional side view of a carrier supported circuit substrate structure formed from the assembly of FIG. 26, in accordance with the third preferred embodiment of the present invention.

FIG. 27 illustrates a partial cross-sectional side view of a carrier supported circuit interconnecting substrate structure 2700, in accordance with the third preferred embodiment of the present invention. The assembly 2700 includes third layer electrically conductive traces 2702 located in the third layer apertures 2606. The third layer electrically conductive traces 2702 are formed from a third layer of metallic powder that is deposited directly on top of the surface 2504 in the third layer apertures 2606. The third layer of metallic powder is then sintered, or melted and solidified, to form the third layer electrically conductive traces 2702. Also, as shown an upper surface 2704 of the assembly 2500 is planar which if necessary has been treated by grinding upper surfaces of the third layer electrically conductive traces 2702 and the third insulating layer 2604.

Figure 28:
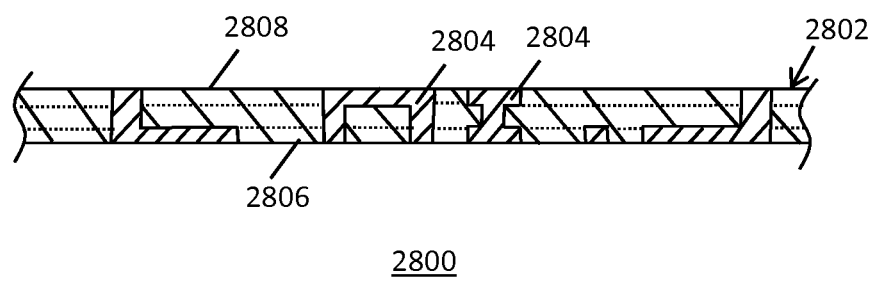
FIG. 28 is a partial cross-sectional side view of the circuit substrate of FIG. 27 when removed from the carrier.

Referring to FIG. 28, there is illustrated a partial cross-sectional side view of a circuit interconnecting substrate structure 2800 when removed from the carrier 2202. As shown, the first second and third insulating layers 2204, 2404 and 2604 form an integrated insulating substrate 2802 which is a sheet with a first side 2806 and a second side 2808. Also, the first, second and third layers of electrically conductive traces 2302, 2502 and 2702 selectively form integrated traces 2804 in which the first layer of electrically conductive traces 2302 is accessible from the first side 2806. In this embodiment the third layer of electrically conductive traces 2702 is accessible from the second side 2208. If necessary the first side and second side 2806, 2804 may be treated by a grinding or cleaning process. The completed circuit interconnecting substrate structure 2800 may be used to form a semiconductor die package such as the package 2100 as will be apparent to a person skilled in the art.

Figure 29:
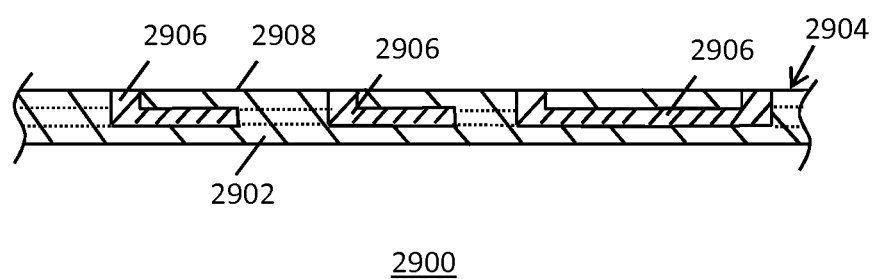
FIG. 29 is a partial cross-sectional side view of a circuit substrate in accordance with the fourth preferred embodiment of the present invention.

FIG. 29 is a partial cross-sectional side view of a circuit interconnecting substrate structure 2900, in accordance with the fourth preferred embodiment of the present invention. The substrate structure 2900 is manufactured by firstly depositing an insulating sheet 2902 onto a carrier. Thereafter a process of depositing one or more additional layers of insulating material and forming layers of conductive traces is performed in a similar fashion to that as described with reference to FIGS. 1 to 28. The insulating sheet 2902 forms part of a final integrated insulating substrate 2904 that supports conductive traces 2906 which in this particular embodiment are only accessible from an upper surface 2908 of the insulating substrate 2904.

Figure 30:
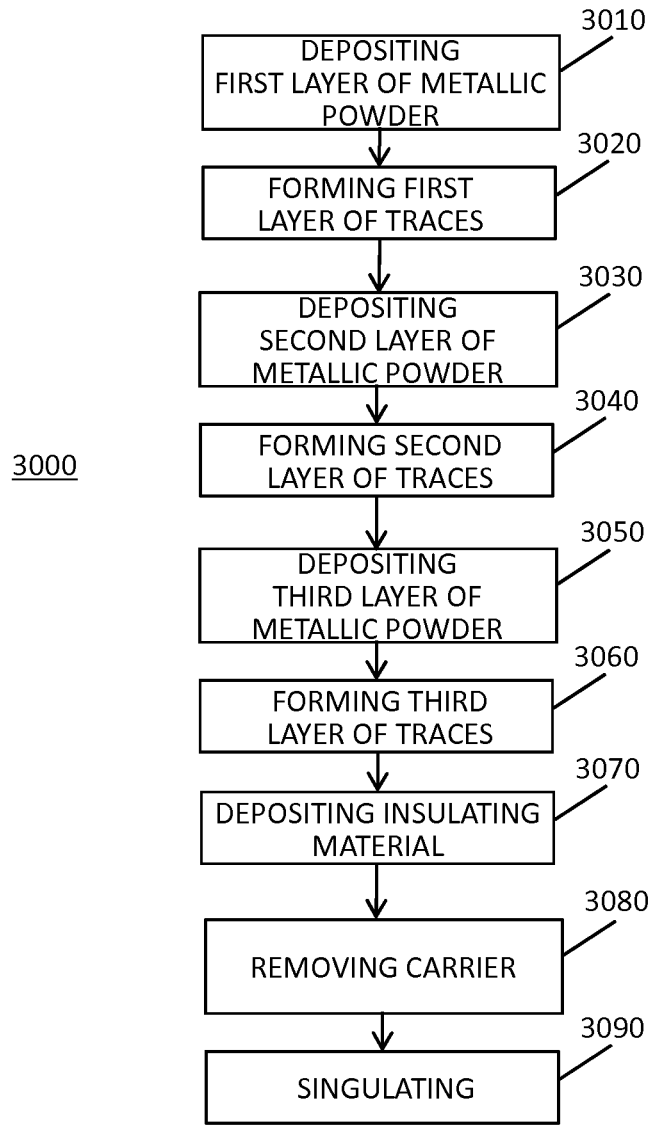
FIG. 30 is a flow chart of a method for manufacturing a circuit substrate according to a preferred embodiment of the present invention.

Referring to FIG. 30, a flow chart illustrating a method 3000 for manufacturing a circuit interconnecting substrate structure according to a preferred embodiment of the present invention. The method 3000 will be described with particular reference to the first embodiment of FIGS. 1 to 9 by way of illustration only and it is to be understood that the method 300 is not limited to this specific first embodiment.

At a first depositing bock 3010 the method 3000 performs a process of depositing the first layer of metallic powder 104 on top of at least one region of the carrier 102. Next, at a first forming block 3020, a process of forming the first layer of electrically conductive traces 202 from the first layer of metallic powder 104 is performed. This process uses selective laser sintering or selective laser melting and solidifying of the first layer of metallic powder 104.

At a second depositing block 3030 a process of depositing the second layer of metallic powder 302 onto at least one region of the first layer of electrically conductive traces 202 is performed. At a second forming block 3040, a process of forming the second layer of electrically conductive traces 402 from the second layer of metallic powder 302 is performed. Each trace of the second layer of electrically conductive traces 402 is electrically coupled to at least one trace of the first layer of electrically conductive traces 202. Again, this process uses selective laser sintering or selective laser melting and solidifying of the second layer of metallic powder 302.

At a third depositing block 3050 a process of depositing the third layer of metallic powder 502 onto at least one region of the second layer of electrically conductive traces 402 is performed. At a third forming block 3060, a process of forming the third layer of electrically conductive traces 602 from the third layer of metallic powder 502 is performed. Each trace of the third layer of electrically conductive traces 602 is electrically coupled to at least one trace of the second layer of electrically conductive traces 402. Again, this process uses selective laser sintering or selective laser melting and solidifying of the third layer of metallic powder 502.

At a fourth depositing block 3070 there is performed a process of depositing the insulating material onto the carrier 102 so that the insulating material provides the insulating substrate 802 that supports the traces 702. The carrier is then removed at a block 3080 and the resulting circuit interconnecting substrate structure 900 is singulated, at a block 3090, by cutting or punching as will be apparent to a person skilled in the art.

As will be apparent to a person skilled in the art the process of depositing the insulating material does not necessarily need to be performed at the fourth depositing block 3070. The process of depositing the insulating material can be performed in layers prior to each of the forming blocks 3020, 3040 and 3060 to form the second embodiment circuit interconnecting substrate structure 2000 as shown in FIGS. 11 to 20. In another alternative the process of depositing the insulating material can be performed in layers prior to each of the depositing blocks 3010, 3030 and 3050 to form the third embodiment circuit interconnecting substrate structure 2900 as shown in FIGS. 22 to 28. Also, the depositing of block 1010 may be directly onto the carrier or alternatively prior to depositing the first layer of metallic powder or insulating material, there can be performed a process of depositing an insulating sheet onto the carrier. Subsequently, the first layer of metallic powder or aperture insulating layer is then deposited onto at least one region of the sheet.

Advantageously, the present invention provides for manufacturing of circuit interconnecting substrate structures for semiconductor die packages and circuit boards without necessarily requiring or using etching, plating, cleaning and the use environmentally unfriendly chemicals. Also, the description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A method of manufacturing a circuit interconnecting substrate, the method comprising:
    depositing a first layer of metallic powder on top of at least one region of a carrier;
    forming a first layer of electrically conductive traces from the first layer of metallic powder;
    depositing a second layer of metallic powder onto at least one region of the first layer of electrically conductive traces;
    forming a second layer of electrically conductive traces from the second layer of metallic powder, each trace of the second layer of electrically conductive traces being electrically coupled to at least one trace of the first layer of electrically conductive traces;
    depositing an insulating material onto the carrier, wherein the insulating material forms an insulating substrate that supports the traces; and
    depositing a third layer of metallic powder onto at least one region of the second layer of electrically conductive traces; and
    forming a third layer of electrically conductive traces from the third layer of metallic powder, each third layer of electrically conductive traces being electrically coupled to at least one of the second layer of electrically conductive traces,
    wherein after forming the third layer of electrically conductive traces, removing regions of the metallic powder that do not form the electrically conductive traces.

2. The method of claim 1, wherein the first layer of metallic powder is deposited directly onto the at least one region of the carrier.

3. The method of claim 1, wherein forming the first and second layers of electrically conductive traces is performed by selective laser sintering of the metallic powder.

4. The method of claim 1, wherein forming the first and second layers of electrically conductive traces is performed by a selective laser melting and solidifying of the metallic powder.

5. The method of claim 1, wherein the depositing of the insulating material is performed after removing the regions of the metallic powder.

6. The method of claim 1, wherein the insulating substrate forms a sheet with a first side and a second side and wherein the first layer of electrically conductive traces is accessible from the first side and the third layer of electrically conductive traces is accessible from the second side.

7. The method of claim 1, wherein after forming the first layer of electrically conductive traces, removing regions of the metallic powder that do not form the first layer of electrically conductive traces.

8. A circuit interconnecting substrate manufactured by a method comprising:
    depositing a first layer of metallic powder on top of at least one region of a carrier;
    forming a first layer of electrically conductive traces from the first layer of metallic powder;
    depositing a second layer of metallic powder onto at least one region of the first layer of electrically conductive traces;
    forming a second layer of electrically conductive traces from the second layer of metallic powder, each trace of the second layer of electrically conductive traces being electrically coupled to at least one trace of the first layer of electrically conductive traces;
    depositing a third layer of metallic powder onto at least one region of the second layer of electrically conductive traces; and
    forming a third layer of electrically conductive traces from the third layer of metallic powder, each trace of the third layer of electrically conductive traces being electrically coupled to at least one trace of the second layer of electrically conductive traces;
    after forming the third layer of electrically conductive traces, removing regions of the metallic powder that do not form the electrically conductive traces; and
    depositing an insulating material onto the carrier, wherein the insulating material provides an insulating substrate that supports the traces.

9. The circuit interconnecting substrate of claim 8, further including a semiconductor die mounted thereon and wherein bonding pads on an active surface of the die are electrically coupled to the traces.

10. The circuit interconnecting substrate of claim 8, wherein the structure is a circuit board.

* * * * *